United States Patent [19]

Fiorentzis

[11] 4,228,398
[45] Oct. 14, 1980

[54] METHOD OF TESTING DISTANCE RELAYS

[75] Inventor: Michael Fiorentzis, Wettingen, Switzerland

[73] Assignee: BBC Brown Boveri & Company Limited, Baden, Switzerland

[21] Appl. No.: 38,880

[22] Filed: May 14, 1979

[30] Foreign Application Priority Data

May 30, 1978 [CH] Switzerland .................. 5874/78

[51] Int. Cl.³ .................................. H01H 47/00
[52] U.S. Cl. ................................. 324/418; 324/52
[58] Field of Search ............. 324/418, 423, 52, 419, 324/420, 421; 361/80, 159

[56] References Cited

U.S. PATENT DOCUMENTS

| | | | |
|---|---|---|---|
| 3,922,587 | 11/1975 | Jones | 361/159 |
| 4,177,419 | 12/1979 | Fiorentzis | 324/418 |

Primary Examiner—David K. Moore
Attorney, Agent, or Firm—Werner W. Kleeman

[57] ABSTRACT

A method of automatically plotting the loci curves of multi-stage distance relays. The comparison impedances, required for the measurement, are automatically provided for given impedance angle by adjustable currents and voltages. During the determination of the loci curves there is started with a defined, predetermined impedance value which is either greater or smaller than that which is sought to be found. By taking the half of this impedance value or by doubling with subsequent halving, when starting with smaller impedance values, it is possible to incrementally approach the sought of impedance value as a function of whether or not, for the corresponding timing stage of the distance relay, its measuring element responds or does not respond.

16 Claims, 2 Drawing Figures

METHOD OF TESTING DISTANCE RELAYS

BACKGROUND OF THE INVENTION

The present invention relates to a new and improved method for the determination of the trip characteristics of distance relays, especially having zone switching, for protection of lines or networks by means of variable comparison impedances, the measuring element of the distance relay being employed as a comparison instrument.

Distance relays are protection relays which are utilized for the distance protection, e.g. for the time stagger protection of high-voltage networks. As a compound relay they consist of excitation element (response element), measuring element and directional element. They are suitable for the selective determination of two-pole and three-pole short-circuits, double ground faults and single-phase ground shorts or faults. By means of the excitation element the currents and voltages are switched to a measuring element or there is turned-on the measuring function of the relay. Generally, a distance relay possesses a measuring device having an image impedance, the phase angle of which corresponds to that of the line and the magnitude of which corresponds to a certain line length or the distance measuring location-short-circuit location, i.e., the so-called trip or zone boundary or region. The image impedance can be switched by means of stepped or stage timing mechanisms, and specifically, in the direction of increased impedances. This procedure will be explained based upon the illustration of FIG. 1, where there have been shown the trip characteristics of loci curves in the complex impedance plane for different zone settings of a distance relay in the form of circles. Upon the occurrence of a fault or short-circuit in the line to be protected the distance relay is energized. At each relay setting, corresponding to a predetermined trip circle or region, line impedances or appropriate comparison impedances or current and voltage values, which are delivered to the relay at a testing circuit, located within the circle, lead to tripping of the relay. Following a set time $t_1$ amounting to, for instance, 200 ms, the distance relay is switched to the trip characteristic or region II. Hence, its distance range is enlarged. The same occurs after expiration of the times $t_2$ and $t_3$ for the trip characteristics or regions III and IV. The switching operations take place within the relay and normally are not externally influenced.

The loci curves of the distance relay characterize its selectivity upon response to short-circuits, and therefore, must be known or measured, as the case may be, prior to use of the distance relay. The plotting of the loci curves or the trip characteristics or regions of a distance relay was accomplished heretofore by manual operations. By means of a current I and a voltage U there is set an impedance Z and switched to the relay. As a function of the reaction of the measuring element, i.e., its response or nonresponse, there are varied the voltage and/or the current, and thus, the impedance by repeated switching-in operations for such length of time until there was obtained a characteristic point. This type of measuring technique is cumbersome, extremely time-consuming and the operational time is dependent upon the skill of the operator in selecting better impedance values.

SUMMARY OF THE INVENTION

Therefore, with the foregoing in mind, it is a primary object of the present invention to provide an improved method of testing distance relays which is not associated with the aforementioned drawbacks and shortcomings of the prior art techniques.

Another and more specific object of the present invention aims at providing an improved method of testing distance relays which is independent of the dexterity of the operator, in order to plot loci curves of the distance relay, and which method can be carried out relatively rapidly.

Now in order to implement these and still further objects of the invention, which will become more readily apparent as the description proceeds, the inventive method for the determination of the trip characteristics of distance relays, especially with zone switching, in the line protection art, by means of variable comparison impedances, there being utilized as the comparison instrument the measuring element of the distance relay, is manifested by the features that, with a predetermined phase angle $\phi$ of the comparison impedance there is undertaken a first trip testing operation with a value of a comparison impedance $Z_1$ which is larger than the magnitude of a predetermined image impedance $Z_A$ of the line. There is then carried out a second trip testing operation with a value or magnitude of the comparison impedance $Z_2 \approx Z_1/2$ which is at least approximately half as large as the magnitude of the first comparison impedance $Z_1$. During each further trip test n, wherein the number n of trip tests can be selected as a function of the desired accuracy, there is carried out a trip test with a magnitude of a comparison impedance $Z_n$ which is increased at least approximately by one-half of the impedance change $$\frac{|Z_{n-2} - Z_{n-1}|}{2}$$

of the preceding trip test, when the magnitude of the image impedance $Z_A$ was greater than the magnitude of the comparison impedance $Z_{n-1}$, or at least reduced by approximately one-half of this impedance change $$\frac{|Z_{n-2} - Z_{n-1}|}{2}$$

of the preceding trip test, when the magnitude of the image impedance $Z_1$ was smaller or equal to the magnitude of the comparison impedance $Z_{n-1}$, and there is available a recording and/or indicating signal proportional to the comparison impedance of the last performed trip test.

Furthermore, the inventive method of determining the trip characteristics of distance relays, especially having protection zone switching, in the line protection art, by means of variable comparison impedances, there being employed the measuring element of the distance relay as the comparison instrument, is further manifested by the features of performing a first relay trip test, with a predetermined phase angle $\phi$ of the comparison impedance $Z_1$ which has a magnitude smaller than the magnitude of a predetermined image impedance $Z_A$ of the line. There is then performed a second trip test, with a magnitude of the image impedance $Z_2 \approx 2 Z_1$ which is at least approximately twice as large as the magnitude of the first comparison impedance $Z_1$. During each further relay trip test n, wherein the number n of the relay trip tests is chosen as a function of the desired accuracy, there is performed a relay trip test with a magnitude of the related comparison impedance $Z_n$ which is increased by at least approximately one-half of the impedance change $$\frac{|Z_{n-2} - Z_{n-1}|}{2}$$

of the preceding relay trip test, when the magnitude of the image impedance $Z_A$ was greater than the magnitude of the comparison impedance $Z_{n-1}$, or such relay trip test is performed with a magnitude of the comparison impedance $Z_n$ which has been reduced by one-half of such impedance change $$\frac{|Z_{n-2} - Z_{n-1}|}{2}$$

of the preceding relay trip test, when the magnitude of the image impedance $Z_A$ was smaller or equal to the magnitude of the comparison impedance $Z_{n-1}$, and there is obtained a recording or indicator signal proportional to the comparison impedance of the last-performed relay trip test.

The inventive method has the advantage that testing of distance relays can be automatically carried out, and the accuracy of the measurement of the characteristic is predeterminable. The automatization of the testing operation of a distance relay constitutes a relatively rapidly performable, automatic preparation of a comparison impedance value $Z_V$ with the aid of a current and a voltage as well as its use at the relay.

BRIEF DESCRIPTION OF THE DRAWINGS

The invention will be better understood and objects other than those set forth above, will become apparent when consideration is given to the following detailed description thereof. Such description makes reference to the annexed drawings wherein.

DETAILED DESCRIPTION OF THE PREFERRED EMBODIMENTS

Figure 1:
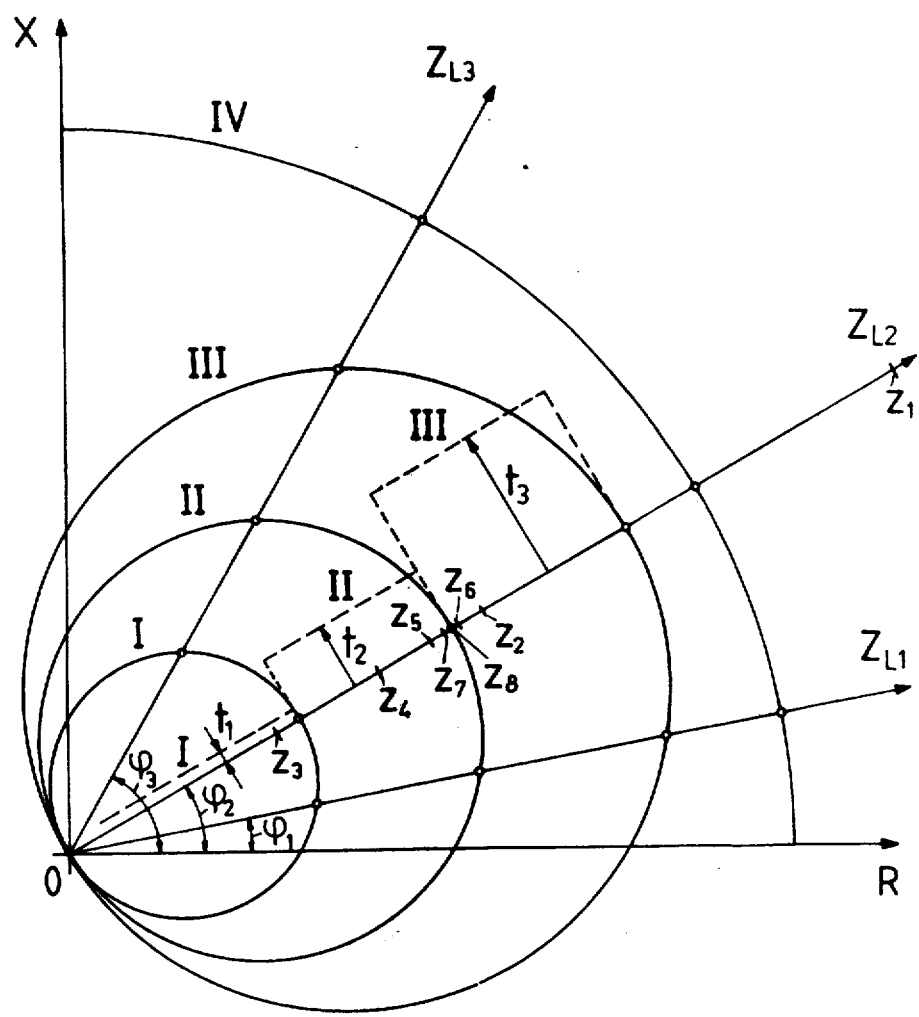
FIG. 1 illustrates loci curves and excitation curves of a distance relay employing, according to the invention, a sequence of comparison impedances $Z_1 \ldots Z_8$ during the determination of a point of the trip characteristic II.

Describing now the drawings, in FIG. 1 there are illustrated three trip characteristics or loci curves I, II and III and an excitation curve IV of a distance relay in the R-X coordinates. In the direction of the abscissa R there have been plotted the real resistances and in the direction of the ordinate X the reactive impedances. The impedance vectors $Z_{L1}$, $Z_{L2}$, $Z_{L3}$, which originate at the null point O, are rotated by the respective phase angle $\phi_1$, $\phi_2$, $\phi_3$ in relation to the R-axis. If in the illustrated arrangement there is supposed that the short-circuit current is located in the R-axis, then such corresponds, at the related vector, to a short-circuit voltage which lags the current by the angle $\phi$. Since at the distance relay the image impedance has been set to the short-circuit angle of the line—in the example under discussion at $\phi_2$—the center points of the trip circle are located along the line vector, in the embodiment under discussion at $Z_{L2}$.

The coordinate starting point constitutes a point of the trip circle. By performing suitable adjustments at the relay, it is possible to place the trip circles such that they intersect the line vector at the desired switching points. These circles or loci curves I, II and III correspond to three timing stages having the trip times $t_1$, $t_2$ and $t_3$ of a distance relay.

With a predetermined magnitude of the current which is to be monitored, which current is detected by the excitation element of the distance relay and characterized by the excitation curve IV, a timing device or mechanism is placed into operation. In the case of impedance values falling within the excitation curve IV, the measuring element is energized or placed into operation so as to perform its measuring operations. The timing mechanism of the measuring element changes the sensitivity of an impedance-measuring converter in predeterminable and adjustable time increments. From the start up to a time $t_1$ the relay is not very sensitive. The short-circuit or fault must be close to the relay, in order to accomplish relay tripping. After the time $t_1$ the sensitivity of the impedance-measuring converter is increased. A corresponding increase of the sensitivity occurs after the trip times $t_2$ and $t_3$. Usually there are provided up to five stages. In order to determine whether or not a relay stage has responded, there is available for each relay stage a contact.

Now if for testing the distance relay there should be plotted a certain trip characteristic, for instance the loci curve II, then there must be ascertained those impedance values Z at which the measuring relay responds at $Z - \Delta Z$ and at $Z + \Delta Z$ does not respond, wherein $\Delta Z$ must be selected to be as small as possible. The total of all such points for different phase angle $\phi$ forms the characteristic or loci curve which is being sought.

Measurement begins for a preselected phase angle, for instance $\phi_2$, with the setting of a comparison impedance $Z_1$. The value of the comparison impedance $Z_1$ is chosen such that the relay does not respond in any event. As the second step there is set the comparison impedance $Z_2$, and its value or magnitude is half as large as the magnitude $Z_1$. The point, corresponding to the comparison impedance $Z_2$, at the line vector $Z_{L2}$, divides the section or path $OZ_1$ into two equal length-partial paths. During the next step, which serves to ascertain the point $Z_3$, one of the two partial paths is halved, and specifically, depending upon whether the measuring element has or has not responded in the stage II which is to be ascertained, at the impedance $Z_2$. If the relay has responded, then the partial path $Z_1Z_2$ is halved, otherwise the partial path $OZ_2$. In the embodiment under discussion there is halved the partial path $OZ_2$. This bisecting or halving method is continued, in the embodiment under discussion, until reaching the impedance $Z_8$, and in each case the partial path or section is halved in the direction $Z_1$ when the relay stage has responded or the partial path halved in direction O when the relay stage has not responded. After eight such halving or bisecting steps it is possible to locate the response point at the characteristic curve or characteristic with an accuracy of about 0.5%. The accuracy can be increased by increasing the number of halving or bisecting steps.

In order to plot further points of the characteristic II there is varied the phase angle $\phi$ and the method is repeated, for instance with the phase angles $\phi_1$ and $\phi_3$. The measurements or trip tests can be carried out with phase angles of 0° to 360°. Frequently adequate are measurements between 0° and 90° in increments of about 15°.

An equivalent method to that described and illustrated in the drawing is a method wherein the magnitude of $Z_1$ in any event is smaller than the magnitude of the image impedance $Z_A$. As a second step there is then set a comparison impedance $Z_2$, the magnitude of which at least approximately is twice as large as that of $Z_1$. During each further step n there is set a comparison impedance $Z_n$, the magnitude of which is increased by at least approximately one-half of the impedance change $$\frac{|Z_{n-2} - Z_{n-1}|}{2}$$

of the preceding trip test, when the magnitude of the image impedance $Z_A$ was greater than that of the comparison impedance $Z_{n-1}$, or which is reduced by at least one-half of this impedance change of the preceding trip test when there is satisfied the condition $|Z_A| - \leq |Z_{n-1}|$. This bisecting or halving method has already been described above.

With both methods there is obtained a recording and/or indicating signal for evaluation purposes, this signal being proportional to the last performed comparison step.

With an automatic testing of a distance relay there are advantageously determined in succession all of the different stages or zones of an impedance value for a phase angle and which impedance value corresponds to the relay. Thereafter, the phase angle is changed and there is carried out a new series of measurements, until there are available the values needed for determining the loci curves.

The comparison impedances are advantageously automatically prepared and switched by combining dual-matched ohmic and inductive resistances, and the computation of the impedance values and the most favorable combination of the resistances is obtained, for instance by using a computer, as will be explained more fully hereinafter.

Figure 2:
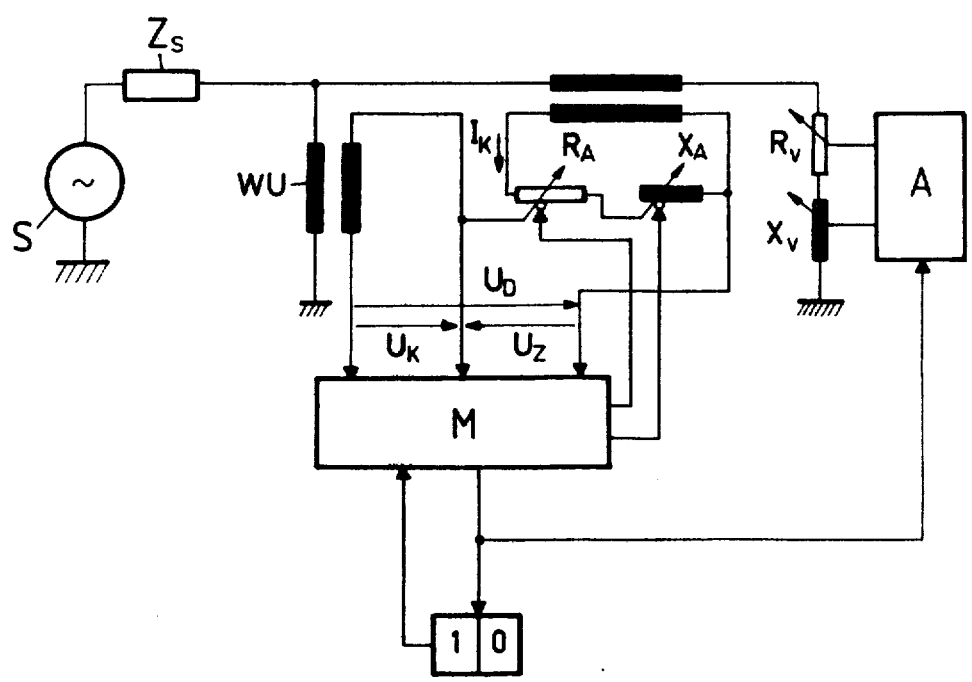
FIG. 2 is a circuit diagram of a test circuit for the determination of the trip characteristics of distance relays.

Now turning attention to FIG. 2, there is shown therein a test circuit for plotting loci curves for a line phase having a voltage source S, possessing a complex internal resistance $Z_S$. The short-circuit voltage $U_K$ which appears at a balancing transformer or converter WU is compared with the voltage $U_Z$ formed by an image or replica impedance $Z_A = R_A + X_A$ equivalent to one of the line impedances and which potential or voltage $U_Z$ is caused by a short-circuit current $I_K$. In the foregoing $R_A$ represents an ohmic image resistance and $X_A$ an image reactance connected in series with the ohmic image resistance or resistor $R_A$.

The comparison occurs in a distance relay measurement circuit M having a measuring element and a stepping or stage timing device. Multi-step distance relays of this type are well known in the art, as exemplified, for instance, in the text entitled "Protective Relays—Their Theory and Practice", Volume One, by A. R. van C. Warrington, published by Chapman & Hall Ltd., London, England, pages 227 to 233, especially FIGS. 5.27 and 5.28. The direction of the difference potential or voltage $U_D = U_K - U_Z$, formed in this measuring circuit M, characterizes the position of the fault location with respect to the measuring location. This measuring circuit M produces that phase shift of the input voltages or potentials corresponding to the measuring position or location of the distance relay. For a point of the loci curve or characteristic wherein $U_K = U_Z \cdot U_K$, there is altered, in the manner previously explained, by means of known, adjustable or combinable comparison impedances $Z_V = R_V + X_V$ in successive steps, for instance, $Z_1 \ldots Z_8$. In the foregoing $R_V$ constitutes an ohmic comparison resistance or resistor and $X_V$ a comparison reactance. The computation of the combination of the resistances $R_V$ and $X_V$, corresponding to a predetermined phase angle $\phi$ of the comparison impedance $Z_V$, as well as their switching, is accomplished by an automatic unit or control A, for instance a suitable computer, as a function whether, during the trip testing operation, the relay has responded (logic signal "1") or not responded (logic signal "0"). The zone switching of the relay and the switching from one loci curve or characteristic to another is accomplished by means of the stepped timing mechanism or unit of the measuring circuit M by stepwise changing the series connected image resistances or resistors $R_A$ and $X_Z$ of the distance relay according to predetermined times.

The automatic testing of the distance relay can be extended to determination of all of the loci curves or characteristics thereof, and it is also possible to automate the succession of the phase angles.

While there are shown and described present preferred embodiments of the invention, it is to be distinctly understood that the invention is not limited thereto, but may be otherwise variously embodied and practiced within the scope of the following claims. Accordingly,

What I claim is:

1. A method for determining the trip characteristics of distance relays, especially having protection zone switching, for protection of an electrical line by means of variable comparison impedances, wherein the distance relay has a measuring element employed as a comparison instrument, comprising the steps of:

performing a first relay trip test, with a predetermined phase angle $\phi$ of the comparison impedance $Z_1$, said comparison impedance having a magnitude greater than the magnitude of a predetermined image impedance $Z_A$ of the line;

performing a second relay trip test, with a magnitude of the comparison impedance $Z_2 \approx Z_1/2$ which is at least approximately half as large as the magnitude of the first comparison impedance $Z_1$;

during each further relay trip test n, wherein the number n of the relay trip tests are selected as a function of the desired accuracy of the trip characteristic to be determined, performing such relay trip test with a magnitude of the related comparison impedance $Z_n$ which has been increased by at least one-half of the impedance change $$\frac{|Z_{n-2} - Z_{n-1}|}{2}$$

of the preceding relay trip test when the magnitude of the image impedance $Z_A$ was greater than the magnitude of the comparison impedance $Z_{n-1}$; or reducing such comparison impedance at least approximately by one-half of such impedance change $$\frac{|Z_{n-2} - Z_{n-1}|}{2}$$

of the preceding relay trip test when the magnitude of the image impedance $Z_A$ is smaller or equal to the magnitude of the comparison impedance $Z_{n-1}$; and producing a signal which is proportional to the comparison impedance of the last performed relay trip test.

2. The method according to claim 1, for a multi-stage distance relay having delayed protection zone switching, comprising the steps of:

determining a step-wise sequence of impedance values corresponding to the delayed protection zone switching of the distance relay.

3. The method according to claim 1, comprising the steps of:

performing the relay trip tests for different phase angles $\phi$ between 0° and 360°.

4. The method according to claim 3, wherein:

said phase angles are in a range between 0° and 90°.

5. The method according to claim 1, further including the steps of:

automatically performing the relay trip tests.

6. The method according to claim 1, further including the steps of:

utilizing currents and voltages for preparing the comparison impedances.

7. The method as defined in claim 6, further including the steps of:

computing the comparison impedances by means of a computer.

8. The method as defined in claim 7, further including the steps of:

automatically combining and switching ohmic resistance means and inductive or capacitive reactive means for obtaining the computated comparison impedances.

9. A method of determining the trip characteristics of distance relays, especially having protection zone switching, for protection of an electrical line by means of variable comparison impedances, the distance relay having a measuring element employed as a comparison instrument, comprising the steps of:

performing a first relay trip test, with a predetermined phase angle $\phi$ of the comparison impedance $Z_1$, said comparison impedance having a magnitude which is smaller than the magnitude of a predetermined image impedance $Z_A$ of the line;

performing a second trip test, with a magnitude of the image impedance $Z_2 \approx 2\, Z_1$ which is at least approximately twice as large as the magnitude of such first comparison impedance $Z_1$;

during each further relay trip test n, wherein the number n of such relay trip tests is chosen as a function of the desired accuracy of the trip characteristic to be determined, performing such relay trip test with a magnitude of the related comparison impedance $Z_n$ which is increased by at least approximately one-half of the impedance change $$\frac{|Z_{n-2} - Z_{n-1}|}{2}$$

of the preceding relay trip test, when the magnitude of the image impedance $Z_A$ was greater than the magnitude of the comparison impedance $Z_{n-1}$; or performing such last-mentioned relay trip test with a magnitude of the comparison impedance $Z_n$ which has been reduced by one-half of such impedance change $$\frac{|Z_{n-2} - Z_{n-1}|}{2}$$

of the preceding relay trip test when the magnitude of the image impedance $Z_A$ was smaller or equal to the magnitude of the comparison impedance $Z_{n-1}$; and obtaining a signal proportional to the comparison impedance of the last-performed relay trip test.

10. The method according to claim 9, for a multi-step distance relay having delayed protection zone switching, comprising the steps of:

determining a step-wise sequence of impedance values corresponding to the delayed protection zone switching of the distance relay.

11. The method according to claim 9, comprising the steps of:

performing the relay trip tests for different phase angles $\phi$ between 0° and 360°.

12. The method according to claim 11, wherein:

said phase angles are in the range between 0' and 90°.

13. The method according to claim 9, further including the steps of:

automatically performing the relay trip tests.

14. The method according to claim 9, further including the steps of:

utilizing currents and voltages for preparing the comparison impedances.

15. The method as defined in claim 14, further including the steps of:

computing the comparison impedances by means of a computer.

16. The method as defined in claim 15, further including the steps of:

automatically combining and switching ohmic resistance means and inductive or capacitive reactive means for obtaining the computated comparison impedances.

* * * * *